United States Patent
Jeong et al.

(10) Patent No.: US 8,072,822 B2
(45) Date of Patent: Dec. 6, 2011

(54) DATA ALIGNMENT CIRCUIT AND METHOD OF SEMICONDUCTOR MEMORY APPARATUS

(75) Inventors: Chun Seok Jeong, Gyeonggi-do (KR); Kee Teok Park, Gyeonggi-do (KR); Chang Sik Yoo, Seoul (KR); Jang Woo Lee, Seoul (KR); Hong Jung Kim, Seoul (KR)

(73) Assignees: Hynix Semiconductor Inc., Gyeonggi-do (KR); Industry-University Cooperation Foundation, Hanyang University, Seoul (KR)

( * ) Notice: Subject to any disclaimer, the term of this patent is extended or adjusted under 35 U.S.C. 154(b) by 154 days.

(21) Appl. No.: 12/649,066

(22) Filed: Dec. 29, 2009

(65) Prior Publication Data

US 2010/0329040 A1 Dec. 30, 2010

(30) Foreign Application Priority Data

Jun. 29, 2009 (KR) .................. 10-2009-0058502

(51) Int. Cl.
*G11C 7/22* (2006.01)
(52) U.S. Cl. .................. 365/189.05; 365/194
(58) Field of Classification Search ............ 365/189.05, 365/194

See application file for complete search history.

(56) References Cited

U.S. PATENT DOCUMENTS

| | | | |
|---|---|---|---|
| 6,026,051 A | 2/2000 | Keeth et al. | |
| 6,160,731 A | 12/2000 | Choi | |
| 6,349,399 B1 | 2/2002 | Manning | |
| 6,636,110 B1 | 10/2003 | Ooishi et al. | |
| 6,643,789 B2 | 11/2003 | Mullarkey | |
| 7,224,625 B2 | 5/2007 | Dietrich et al. | |
| 2007/0257717 A1* | 11/2007 | Yoon | 327/153 |
| 2008/0181348 A1* | 7/2008 | Best et al. | 375/376 |
| 2009/0091992 A1* | 4/2009 | Lee | 365/193 |

FOREIGN PATENT DOCUMENTS

| | | |
|---|---|---|
| JP | 11-316617 A | 11/1999 |
| JP | 11-328963 A | 11/1999 |
| KR | 1020090067797 A | 6/2009 |

OTHER PUBLICATIONS

Evelina Yeung, et al; "A 2.4 Gb/s/pin Simultaneous Bidirectional Parallel Link with Per-Pin Skew Compensation", IEEE Journal of Solid-State Circuits, vol. 35, No. 11, Nov. 2000, (no exact date given) pp. 1619-1629.

Sung Ho Wang et al; "A 500-Mb/s Quadruple Data Rate SDRAM Interface Using a Skew Cancellation Technique", IEEE Journal of Solid-State Circuits, vol. 36, No. 4, Apr. 2001 (no exact date given), pp. 648-657.

* cited by examiner

*Primary Examiner* — Michael Tran

(57) ABSTRACT

A data alignment circuit of a semiconductor memory apparatus includes: a data strobe clock phase control block configured to control a phase of a data strobe clock signal in response to a strobe delay code and generate a delayed strobe clock signal; a plurality of data phase control blocks configured to control phases of input data in response to data delay codes and generate delayed data; a plurality of data alignment blocks configured to latch the delayed data in response to the delayed strobe clock signal and generate latched data and aligned data; and a delay code generation block configured to perform an operation of determining phases of the latched data and generate the strobe delay code and the data delay codes.

20 Claims, 6 Drawing Sheets

DATA ALIGNMENT CIRCUIT AND METHOD OF SEMICONDUCTOR MEMORY APPARATUS

CROSS-REFERENCES TO RELATED APPLICATION

The present application claims priority under 35 U.S.C. §119(a) to Korean application number 10-2009-0058502, filed on Jun. 29, 2009 in the Korean Intellectual Property Office, which is incorporated herein by reference in its entirety as set forth in full.

BACKGROUND

The present invention relates generally to a semiconductor memory apparatus, and more particularly, to data alignment circuit and method of a semiconductor memory apparatus.

Generally, a semiconductor memory apparatus transmits and receives multi-bit data in series using an external memory controller. On the other hand, a plurality of global data buses (GIO) are provided inside of the semiconductor memory apparatus in order to transmit multi-bit data to a core area or output multi-bit data from a core area, and the multi-bit data transmitted through the global data buses are arranged in parallel. In this manner, multi-data data is transmitted in parallel inside of the semiconductor memory apparatus but is transmitted in series outside of the semiconductor memory apparatus. Thus, a circuit for aligning serial data in parallel is required in a data input area, and a circuit for aligning parallel data in series is required in a data output area. To this end, the semiconductor memory apparatus is configured to include data alignment circuits in the data input area and the data output area.

Generally, the data alignment circuit of the semiconductor memory apparatus provided in the data input area is configured to perform synchronization of data inputted through a plurality of data pads by using a data strobe clock signal (DQS), synchronizing the data with an internal clock signal, and transferring the data to the global data buses. In a semiconductor memory device such as a double data rate synchronous dynamic random access memory (DDR SDRAM), a faster data input operation may be performed by latching data bits at rising and falling edges of the data strobe clock signal (DQS). The internal clock signal is generated from a delay locked loop (DLL) circuit or a phase locked loop (PLL) circuit and has recently been implemented in the form of a multi-phase clock signal in order to support a faster operation speed.

However, it is difficult to exactly synchronize the timing of a plurality of data transferred to data pads from outside of the semiconductor memory device, and often a slight timing difference occurs among the plurality of data. As development of the semiconductor memory apparatus is advanced to perform higher-speed operation, even a slight difference of data input timing may cause malfunction in a data alignment operation. Accordingly, a conventional data alignment circuit of a semiconductor memory apparatus should be configured in a structure for preventing such a malfunction.

FIG. 1 is a schematic configuration diagram of a conventional data alignment circuit of a semiconductor memory apparatus, illustrating a block which extracts phase information of input data.

Referring to FIG. 1, the conventional data alignment circuit of the semiconductor memory apparatus includes: a counter 1 configured to generate a counting signal CNT; a multiplexer (MUX) 2 configured to sequentially output first through eighth data DQ<1:8>; first through eighth flip-flops FF1 through FF8 configured to latch first through eighth clock signals CLK<1:8> in response to the data transferred from the multiplexer 2; an encoder 3 configured to encode output signals of the first through eighth flip-flops FF1 through FF8 and generate a 3-bit encoding signal ENC; and a register 4 configured to store the encoding signal ENC.

The first through eighth clock signals CLK<1:8> are multi-phase clock signals generated from a DLL circuit or a PLL circuit, and the clock signals are generated by dividing a phase of a single clock signal by 8. When the multiplexer 2 transfers any one of the first through eighth data DQ<1:8> to the first through eighth flip-flops FF1 to FF8, the flip-flop to which a clock signal whose phase leads the phase of the data is inputted outputs a high-level signal, and the flip-flop to which a clock signal whose phase lags behind the phase of the data is inputted outputs a low-level signal. During such a phase information extraction operation, all of the first through eighth data DQ<1:8> are controlled to have a high-level potential.

The encoder 3 is configured to encode the output signals of the first through eighth flip-flops FF1 through FF8, and transfer the encoded signals to the register 4. The register 4 is configured to store phase information of the 1-bit data. Subsequently, if the multiplexer 2, the first through eighth flip-flops FF1 through FF8, and the encoder 3 are repetitively operated, the register 4 can store phase information of the respective bits of the first through eighth data DQ<1:8>.

Subsequently, the phase information of the respective bits of the first through eighth data DQ<1:8>, which are stored in the register 4, are used to control the phases of the first through eighth data DQ<1:8> in a circuit area (not shown). In such a manner, the data alignment circuit of the semiconductor memory apparatus can support a stable data input operation by performing the operation of controlling the respective phases of the first through eighth data DQ<1:8> and aligning the first through eighth data DQ<1:8>.

However, since the above-described data alignment circuit must receive the multi-phase clock signals from the DLL circuit or the PLL circuit upon its operation, a large number of signal lines are necessarily provided in the data alignment circuit. Therefore, a disadvantage arises in that the area efficiency is degraded. Furthermore, as a complicated circuit configuration is provided for extracting the phase information of the data, the design facilitation is degraded. As such, the conventional data alignment circuit of the semiconductor memory apparatus has a technical limitation in that the occupied area is large and the design facilitation is degraded, which serves as a factor to obstruct the implementation of a high-performance semiconductor memory apparatus.

SUMMARY

Embodiment of the present invention include a data alignment circuit of a semiconductor memory apparatus, which improves the area efficiency and the design facilitation, and a data alignment method thereof.

In one embodiment of the present invention, a data alignment circuit of a semiconductor memory apparatus includes: a data strobe clock phase control block configured to control a phase of a data strobe clock signal in response to a strobe delay code and generate a delayed strobe clock signal; a plurality of data phase control blocks configured to control phases of input data in response to data delay codes and generate delayed data, respectively; a plurality of data alignment blocks configured to latch the delayed data in response to the delayed strobe clock signal and generate latched data and aligned data, respectively; and a delay code generation block configured to perform an operation of determining phases of the latched data and generate the strobe delay code and the data delay codes.

In another embodiment of the present invention, a data alignment circuit of a semiconductor memory apparatus includes: a delay code generation block configured to receive a plurality of data, extract phase information of data having the most lagging phase, and output the extracted information as a strobe delay code; a data strobe clock phase control block configured to control a phase of a data strobe clock signal in response to the strobe delay code and generate a delayed strobe clock signal; and a plurality of data alignment blocks configured to perform data latch operations by using the delayed strobe clock signal, output the plurality of data, and perform data alignment operations on the plurality of data, respectively.

In another embodiment of the present invention, a data alignment method of a semiconductor memory apparatus includes the steps of: a) determining phases of a plurality of input data and extracting phase information of data having the most lagging phase; b) delaying a data strobe clock signal by using the extracted phase information and synchronizing the delayed data strobe clock signal with the data having the most lagging phase; and c) sequentially delaying the plurality of input data one by one so that the delayed input data have the same phase as the phase-adjusted data strobe clock signal.

BRIEF DESCRIPTION OF THE DRAWINGS

Features, aspects, and embodiments are described in conjunction with the attached drawings, in which.

DETAILED DESCRIPTION

Hereinafter, a data alignment circuit and method of a semiconductor memory apparatus, according to the present invention, will be described below with reference to the accompanying drawings through preferred embodiments.

Figure 1:
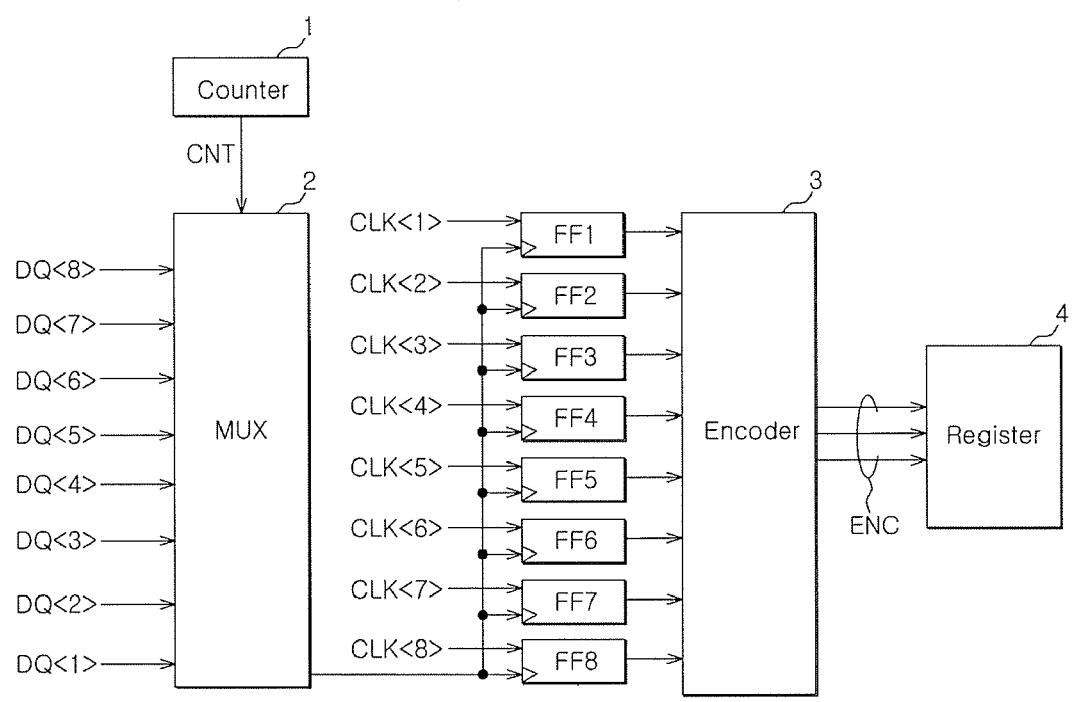
FIG. 1 is a schematic configuration diagram of a conventional data alignment circuit of a semiconductor memory apparatus.
Figure 2:
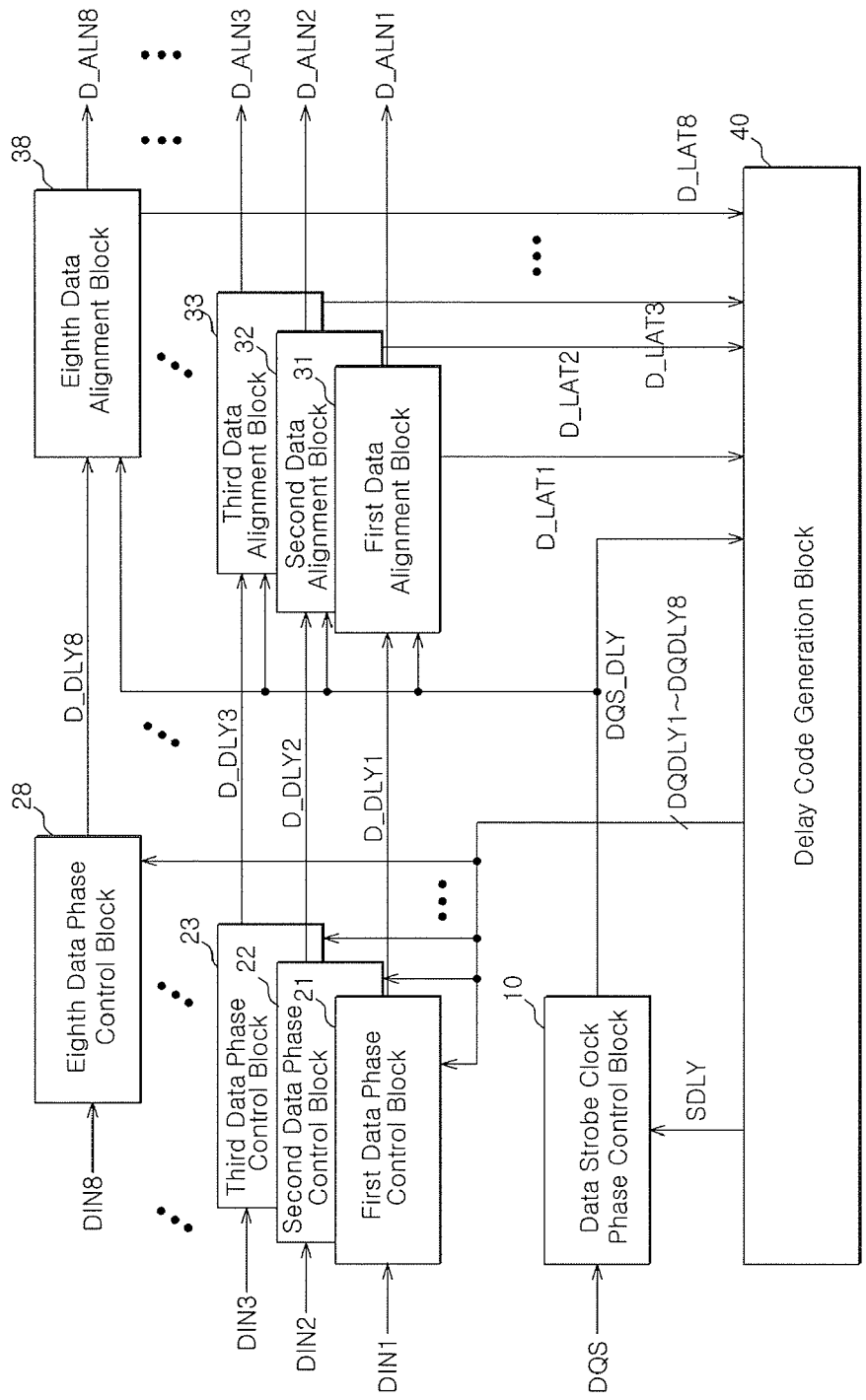
FIG. 2 is a block diagram showing the configuration of a data alignment circuit of a semiconductor memory apparatus according to one embodiment.

FIG. 2 is a block diagram showing the configuration of a data alignment circuit of a semiconductor memory apparatus according to one embodiment of the present invention.

Referring to FIG. 2, the data alignment circuit of the semiconductor memory apparatus according to one embodiment includes: a data strobe clock phase control block 10 configured to control the phase of a data strobe clock signal DQS in response to a strobe delay code SDLY and generate a delayed strobe clock signal DQS_DLY; first through eighth data phase control blocks 21 through 28 configured to control the phases of first through eighth input data DIN1 through DIN8 in response to first through eighth data delay codes DQDLY1 through DQDLY8 and generate first through eighth delayed data D_DLY1 through D_DLY8, respectively; first through eighth data alignment blocks 31 through 38 configured to latch the first through eighth delayed data D_DLY1 through D_DLY8 in response to the delayed strobe clock signal DQS_DLY and generate first through eighth latched data D_LAT1 through D_LAT8 and first through eighth aligned data D_ALN1 through D_ALN8; and a delay code generation block 40 configured to perform an operation of determining the phases of the first through eighth latched data D_LAT1 through D_LAT8 in response to the delayed strobe clock signal DQS_DLY and generate the strobe delay code SDLY and the first through eighth data delay codes DQDLY1 through DQDLY8.

The data strobe clock signal DQS and the first through eighth input data DIN1 through DIN8 are, for example, signals inputted from an external memory controller. The first through eighth input data DIN1 through DIN8 have a high-level potential during an initial data alignment operation, that is, during an operation in which the delay amounts of the first through eighth input data DIN1 through DIN8 are set.

At the point of time when the operation of the data alignment circuit starts, the data strobe clock phase control block 10 and the first through eighth data phase control blocks 21 through 28 assign a preset delay time to the data strobe clock signal DQS and the first through eighth input data DIN1 through DIN8, and generate the delayed strobe clock signal DQS_DLY and the first through eighth delayed data D_DLY1 through D_DLY8.

Subsequently, the first through eighth data alignment blocks 31 through 38 latch the first through eighth delayed data D_DLY1 through D_DLY8 using the delayed strobe clock signal DQS_DLY, generate the first through eighth latched data D_LAT1 through D_LAT8, and transfer the generated first through eighth latched data D_LAT1 through D_LAT8 to the delay code generation block 40, respectively. In addition, the first through eighth data alignment blocks 31 through 38 latch the first through eighth latched data D_LAT1 through D_LAT8 by using the delayed strobe clock signal DQS_DLY, generate the first through eighth aligned data D_ALN1 through D_ALN8, and transfer the generated first through eighth aligned data D_ALN1 through D_ALN8 through global data lines (not shown) to a core circuit area (not shown), respectively.

The delay code generation block 40 receives the first through eighth latched data D_LAT1 through D_LAT8, extracts phase information of the data whose phase is lagging the most among the first through eighth latched data D_LAT1 through D_LAT8, and generates the strobe delay code SDLY. The data strobe clock phase control block 10 delays the data strobe clock signal DQS according to the logic value of the strobe delay code SDLY, and generates the delayed strobe clock signal DQS_DLY. In this case, the phase of the delayed strobe clock signal DQS_DLY is synchronized with the phase of the data whose phase is lagging the most among the first through eighth latched data D_LAT1 through D_LAT8.

Subsequently, the delay code generation block 40 extracts phase information of the first latched data D_LAT1. Specifically, the delay code generation block 40 extracts information regarding how much the phase of the first latched data D_LAT1 leads the phase of the delayed strobe clock signal DQS_DLY, and transfers the extracted information to the first data phase control block 21 as the first data delay code DQDLY1. The first data phase control block 21 delays the first data delay code DQDLY1 according to the logic value of the first data delay code DQDLY1, and generates the first delayed data D_DLY1. In this case, the phase of the first delayed data D_DLY1 is synchronized with the phase of the delayed strobe clock signal DQS_DLY.

The delay code generation block 40 and the second through eighth data phase control blocks 22 through 28 sequentially perform the above-described operations on the second through eighth input data DIN2 through DIN8. Accordingly, the phases of the first through eighth delayed data D_DLY1 through D_DLY8 become substantially equal to one another. Since the data alignment operation of the first through eighth data alignment blocks 31 through 38 is performed on the phase-synchronized first through eighth delayed data D_DLY1 through D_DLY8, the data alignment operation can be performed more stably.

As such, the data alignment circuit of the semiconductor memory apparatus according to one embodiment can perform the data alignment operation stably and without using additional clock signals by adjusting the phase of the data strobe clock signal DQS and synchronizing the phases of the input data DIN1 through DIN8 with the phase-adjusted data strobe clock signal DQS. Therefore, the area occupied by the data alignment circuit of the semiconductor memory apparatus is remarkably reduced compared to the related art. Furthermore, since no additional clock signals are required, the design facilitation can also be improved.

Figure 3:
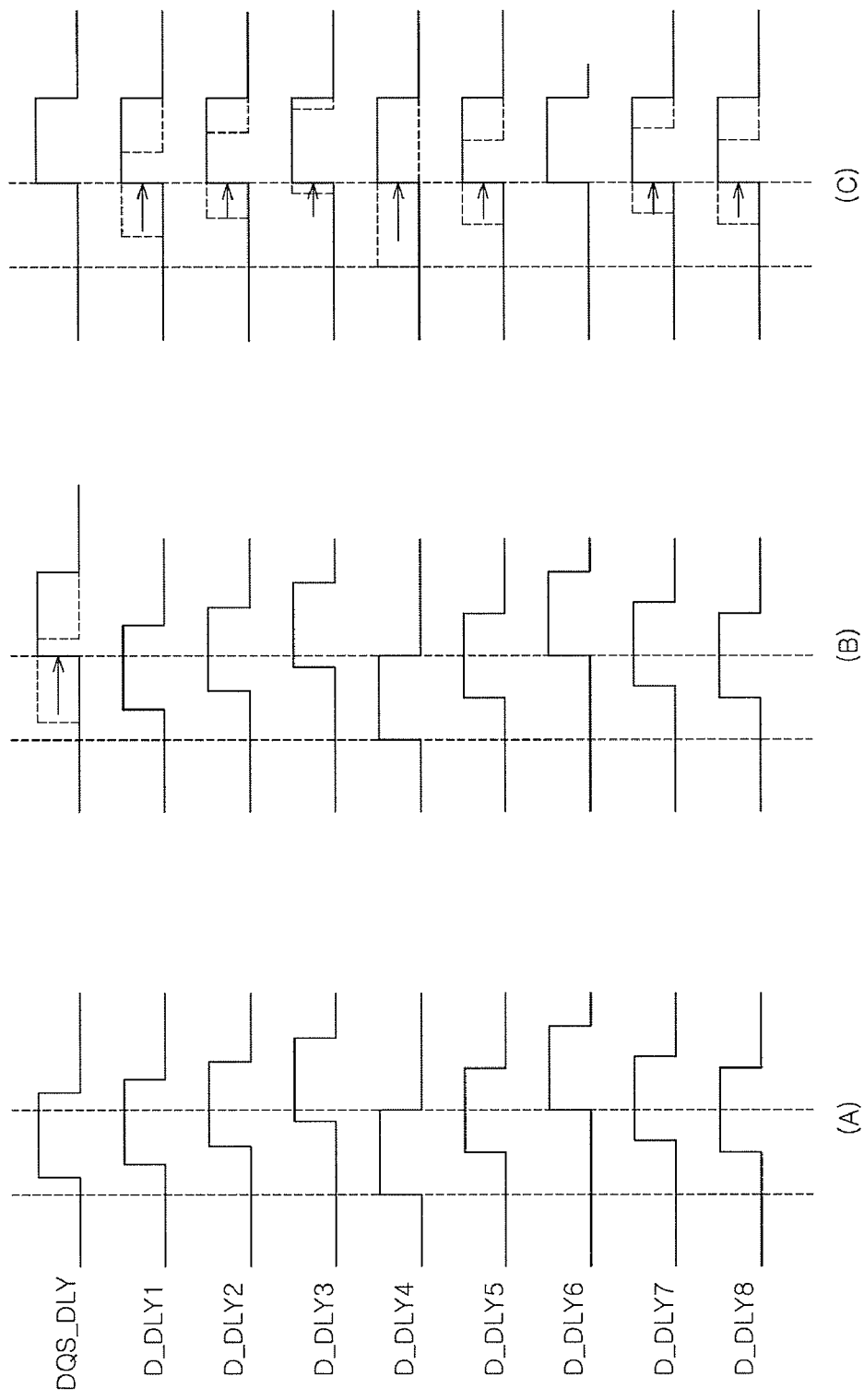
FIG. 3 is a timing diagram for explaining the operation of the data alignment circuit shown in FIG. 2.

The above-described operation of the data alignment circuit of the semiconductor memory apparatus can be understood more easily through the timing diagram of FIG. 3.

FIG. 3 is a timing diagram for explaining the operation of the data alignment circuit of the semiconductor memory apparatus shown in FIG. 2.

In FIG. 3, the delayed strobe clock signal DQS_DLY generated by delaying the data strobe clock signal DQS, and the first through eighth delayed data D_DLY1 through D_DLY8 generated by delaying the first through eighth input data DIN1 through DIN8 are illustrated.

A section indicated by (A) shows the delayed strobe clock signal DQS_DLY and the first through eighth delayed data D_DLY1 through D_DLY8 in their initial states where the preset delay amounts are assigned to the data strobe clock signal DQS and the first through eighth input data DIN1 through DIN8. As shown, in the initial operation of the data alignment circuit of the semiconductor memory apparatus, the phase of the data strobe clock signal DQS and the phases of the first through eighth input data DIN1 through DIN8 are inputted while not being synchronized with one another.

Subsequently, referring to a section (B), the data alignment circuit of the semiconductor memory apparatus delays the data strobe clock signal DQS and generates the delayed strobe clock signal DQS_DLY. In this case, the data alignment circuit performs the operation of synchronizing the phase of the data whose phase is lagging the most (e.g., D_DLY6) with the phase of the delayed strobe clock signal DQS_DLY. Such an operation is achieved as follows: the delay code generation block 40 determines the phases of the first through eighth latched data D_LAT1 through D_LAT8 and extracts the phase information of the data whose phase is lagging the most among the plurality of input data, and the data strobe clock phase control block 10 performs the operation of delaying the data strobe clock signal DQS by using the extracted phase information.

Subsequently, as shown in a section (C), the data alignment circuit of the semiconductor memory apparatus sequentially delays the first through eighth input data DIN1 through DIN8 one by one so that they have the same phase as the phase-adjusted delayed strobe clock signal DQS_DLY, and generates the first through eighth delayed data D_DLY1 through D_DLY8.

In this manner, the operation of synchronizing the phases of the delayed strobe clock signal DQS_DLY and the first through eighth delayed data D_DLY1 through D_DLY8 is completed.

Figure 4:
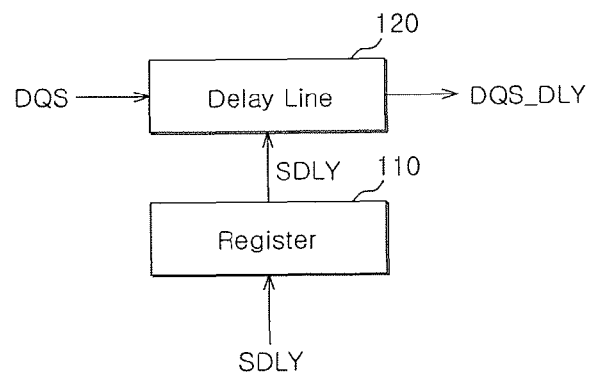
FIG. 4 is a configuration diagram of an embodiment of the data strobe clock phase control block shown in FIG. 2.

FIG. 4 is a detailed configuration diagram of an embodiment of the data strobe clock phase control block shown in FIG. 2.

Referring to FIG. 4, the data strobe clock phase control block 10 includes: a register 110 configured to store the strobe delay code SDLY; and a delay line 120 configured to delay the data strobe clock signal DQS in response to the strobe delay code SDLY transferred from the register 110, and output the delayed strobe clock signal DQS_DLY.

With such a configuration, the data strobe clock phase control block 10 can variably delay the data strobe clock signal DQS according to variation in the logic value of the strobe delay code SDLY. Furthermore, since the strobe delay code SDLY is stored in the register 110, the delayed strobe clock signal DQS_DLY can be generated by continuously assigning the fixed delay amount to the data strobe clock signal DQS once the logic value of the strobe delay code SDLY is fixed.

Meanwhile, the first through eighth data phase control blocks 21 through 28 may be configured in the same structure as the data strobe clock phase clock control block 10, except of course that the input/output signals are different. For brevity, the configuration of the data strobe clock phase control block 10 alone has been described herein.

Figure 5:
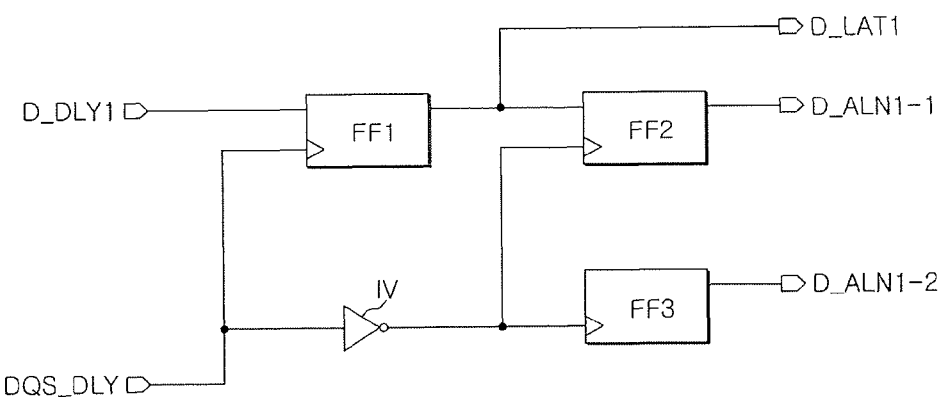
FIG. 5 is a configuration diagram of an embodiment of the first data alignment block shown in FIG. 2.

FIG. 5 is a detailed configuration diagram of an embodiment of the first data alignment block shown in FIG. 2. Since the first through eighth data alignment blocks 31 through 38 may be configured in the same structure, the first data alignment block 31 alone is illustrated for brevity. Also, a DDR SDRAM is exemplified herein as an example of the semiconductor memory apparatus. Accordingly, since the first delayed data D_DLY1 has 2 bits, the first aligned data D_ALN1 is implemented as a $1\text{-}1^{th}$ aligned data D_ALN1-1 and a $1\text{-}2^{th}$ aligned data D_ALN1-2.

Referring to FIG. 5, the first data alignment block 31 includes: a first flip-flop FF1 configured to latch the first delayed data D_DLY1 in response to the delayed strobe clock signal DQS_DLY and generate the first latched data D_LAT1; an inverter IV configured to receive the delayed strobe clock signal DQS_DLY; a second flip-flop FF2 configured to latch an output signal of the first flip-flop FF1 in response to an output signal of the inverter IV and output the $1\text{-}1^{th}$ aligned data D_ALN1-1; and a third flip-flop FF3 configured to latch the first delayed data D_DLY1 in response to the output signal of the inverter IV and output the $1\text{-}2^{th}$ aligned data D_ALN1-2.

With such a configuration, the first data alignment block 31 latches the first delayed data D_DLY1 at a falling edge time of the delayed strobe clock signal DQS_DLY and outputs the latched data as the $1\text{-}2^{th}$ aligned data D_ALN1-2. The first data alignment block 31 latches the first delayed data D_DLY1 at a rising edge time of the delayed strobe clock signal DQS_DLY and outputs the first latched data D_LAT1. Subsequently, the first data alignment block 31 latches the first latched data D_LAT1 at a falling edge time of the delayed strobe clock signal DQS_DLY and outputs the latched data as the $1\text{-}1^{th}$ aligned data D_ALN1-1. That is, the first data alignment block 31 performs the operation of aligning the consecutively inputted 2-bit data in parallel.

Figure 6:
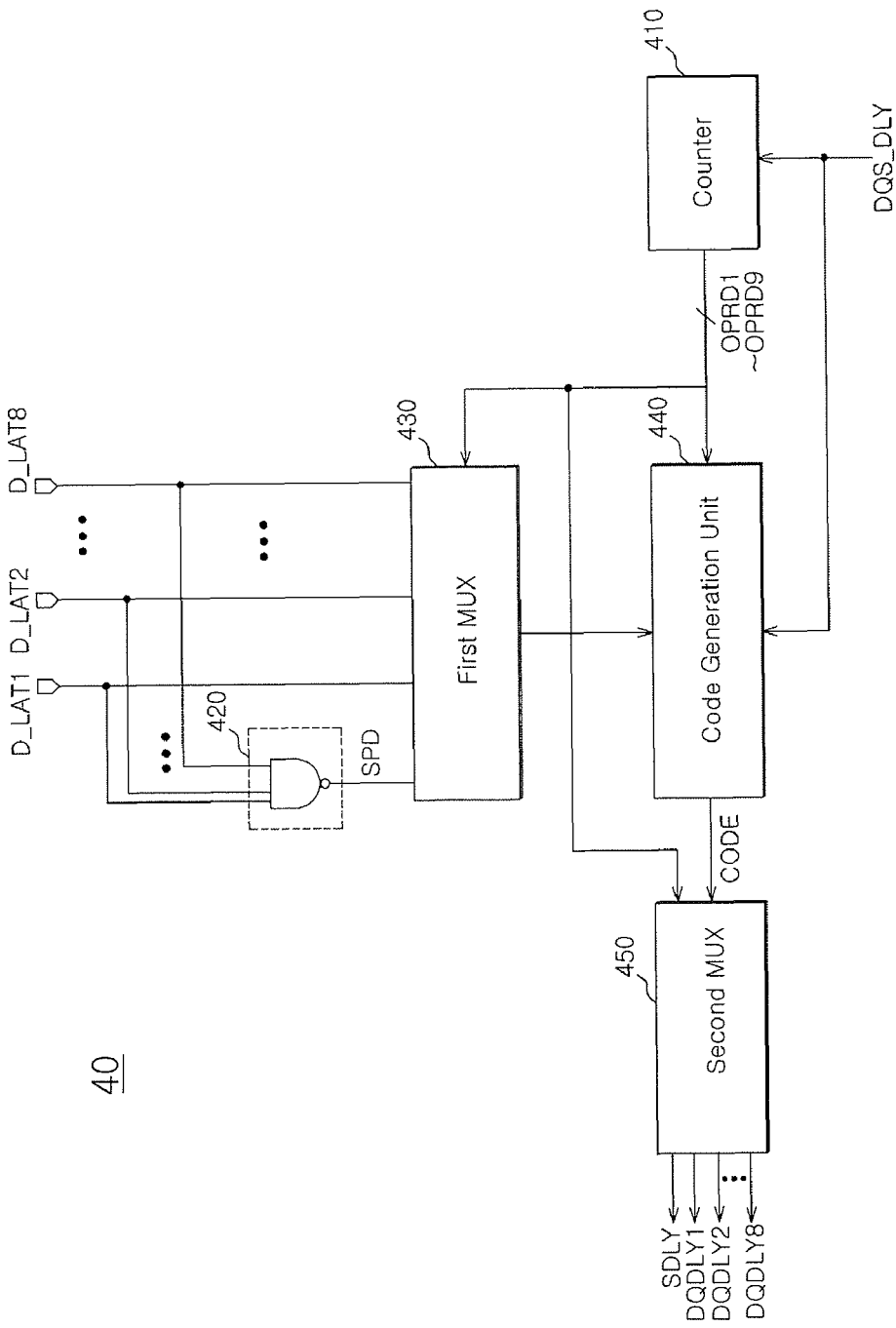
FIG. 6 is a configuration diagram of an embodiment of the delay code generation block shown in FIG. 2.

FIG. 6 is a detailed configuration diagram of an embodiment of the delay code generation block shown in FIG. 2.

Referring to FIG. 6, the delay code generation block 40 includes: a counter 10 configured to perform a counting operation in response to the delayed strobe clock signal DQS_DLY and generate first through ninth operation duration signals OPRD1 through OPRD9; a phase determination unit 420 configured to receive the first through eighth latched data D_LAT1 through D_LAT8 and generate a strobe phase determination signal SPD; a first multiplexer 430 configured to sequentially output the strobe phase determination signal SPD and the first through eighth latched data D_LAT1 through D_LAT8 one by one in response to the first through ninth operation duration signals OPRD1 through OPRD9; a code generation unit 440 configured to generate a multi-bit digital code CODE corresponding to a logic value of the signal, which is transferred from the first multiplexer 430, in response to the first through ninth operation duration signals OPRD1 through OPRD9 and the delayed strobe clock signal DQS_DLY; and a second multiplexer 450 configured to sequentially output the multi-bit digital code CODE as the strobe delay code SDLY and the first through eighth data delay codes DQDLY1 through DQDLY8 in response to the first through ninth operation duration signals OPRD1 through OPRD9.

Figure 7:
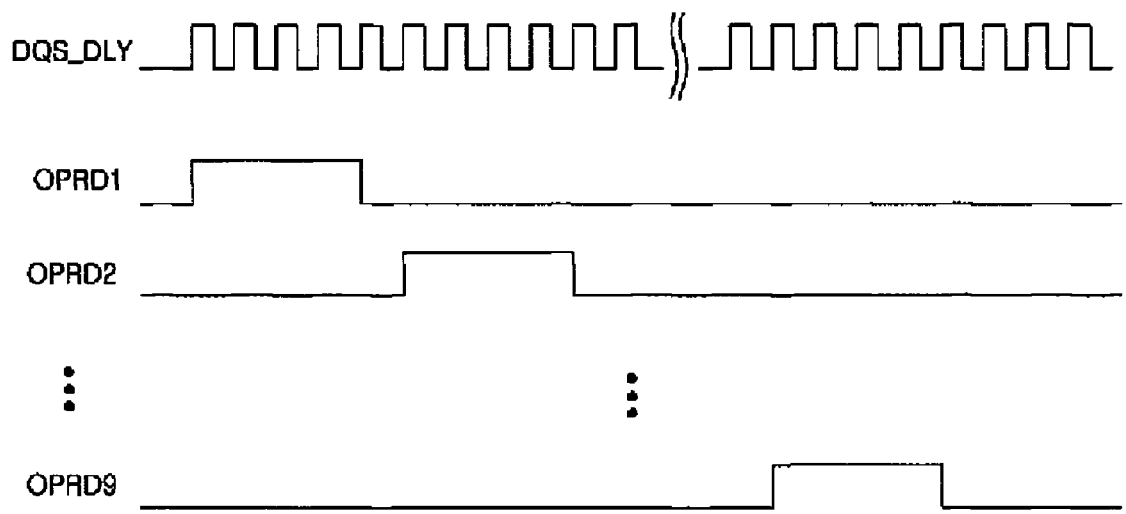
FIG. 7 is a waveform diagram of first through ninth operation duration signals generated from the counter shown in FIG. 6.

The waveforms of the first through ninth operation duration signals OPRD1 through OPRD9 generated from the counter 410 are illustrated in FIG. 7. As shown in FIG. 7, the first through ninth operation duration signals OPRD1 through OPRD9 have predetermined enable periods and are sequentially enabled. FIG. 7 shows that the first through ninth operation duration signals OPRD1 through OPRD9 have enable periods (i.e., duration of enablement) that are four times the period of the delayed strobe clock signal DQS_DLY. The enable periods are determined considering the time necessary for the code generation unit 440 to generate the digital code CODE. That is, the code generation unit 440 sets the logic value of the digital code CODE through a plurality of stages (herein, three stages). In this case, one stage refers to a procedure lasting until the signal influenced by the digital code CODE generated from the code generation unit 440 of the delay code generation block 40 configured in a feedback loop structure is again inputted from the first multiplexer 430 to the code generation unit 440, after the code generation unit 440 generates the digital code CODE. In other words, the respective enable periods of the first through ninth operation duration signals OPRD1 through OPRD9 must be previously determined according to the time taken until the logic value of the digital code CODE is finally set through a plurality of times of the feedback procedure.

Although not shown, the code generation unit 440 performs an OR operation on the first through ninth operation duration signals OPRD1 through OPRD9 and uses the resulting signal as an enable signal. That is, the code generation unit 440 is activated when any one of the first through ninth operation duration signals OPRD1 through OPRD9 is enabled, and performs the operation of generating the digital code CODE. There is a period where all the first through ninth operation duration signals OPRD1 through OPRD9 are disabled which may be long as one period of the delayed strobe clock signal DQS_DLY at each interval between the respective enable periods of the first through ninth operation duration signals OPRD1 through OPRD9, and the code generation unit 440 initializes the logic value of the digital code CODE during this period.

The first multiplexer 430 sequentially transfers the strobe phase determination signal SPD and the first through eighth latched data D_LAT1 through D_LAT8 to the code generation unit 440 in response to the sequentially enabled first through ninth operation duration signals OPRD1 through OPRD9. Furthermore, the second multiplexer 450 sequentially outputs the digital code CODE as the strobe delay code SDLY and the first through eighth data delay codes DQDLY1 through DQDLY8 in response to the first through ninth operation duration signals OPRD1 through OPRD9.

The phase determination unit 420 includes a NAND gate and is configured to generates a high-level strobe phase determination signal SPD when any one of the first through eighth latched data D_LAT1 through D_LAT8 has a low-level potential, and to generate a low-level strobe phase determination signal SPD when all the first through eighth latched data D_LAT1 through D_LAT8 have a high-level potential. That is, only if the phase of the delayed strobe clock signal DQS_DLY leads the phase of any one of the first through eighth delayed data D_DLY1 through D_DLY8, the corresponding latched data among the first through eighth latched data D_LAT1 through D_LAT8 has a low-level potential and therefore the strobe phase determination signal SPD has a high-level potential. On the other hand, if the phase of the delayed strobe clock signal DQS_DLY lags behind the phases of all the first through eighth latched data D_LAT1 through D_LAT8, the first through eighth latched data D_LAT1 through D_LAT8 have a high-level potential and therefore the strobe phase determination signal SPD has a low-level potential. In other words, the strobe phase determination signal SPD has a logic value corresponding to how much the phase of the delayed strobe clock signal DQS_DLY is adjusted.

The code generation unit 440 generates the digital code CODE having a logic value corresponding to a state of the strobe phase determination signal SPD. The digital code CODE generated at this time is transferred to the data strobe clock phase control block 10 as the strobe delay code SDLY and used to adjust the phase of the delayed strobe clock signal DQS_DLY.

Subsequently, the code generation unit 440 generates the digital code CODE having a logic value corresponding to a state of the first latched data D_LAT1. At this time, the state of the first latched data D_LAT1 is determined according to whether the phase of the first delayed data D_DLY1 leads or lags behind the phase of the strobe delay code SDLY. The digital code CODE generated from the code generation unit 440 is transferred to the first data phase control block 21 as the first data delay code DQDLY1 and used to adjust the phase of the first delayed data D_DLY1.

The code generation unit 440 repeats the above-described operation until the eighth data delay code DQDLY8 is generated using the eighth latched data D_LAT8.

The code generation unit 440 operates in response to the delayed strobe clock signal DQS_DLY and can be easily implemented in the form of a counter configured to decrease the logic value of the digital code CODE when the logic value of the signal transferred from the first multiplexer 430 is '0', and increase the logic value of the digital code CODE when the logic value of the signal transferred from the first multiplexer 430 is '1'. The operation time can be reduced by implementing the code generation unit 440 in the form of a successive approximation counter.

Figure 8:
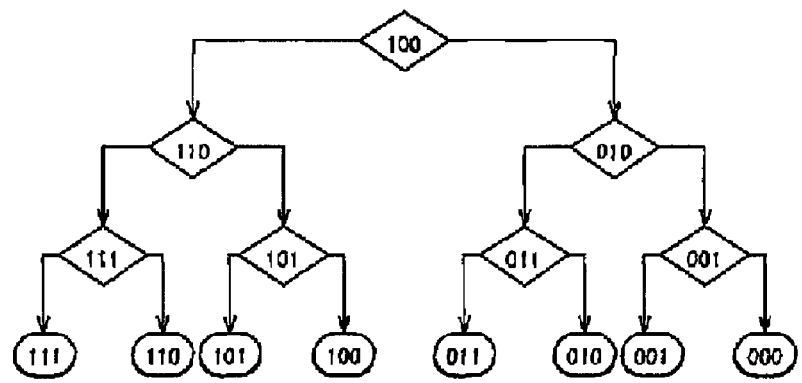
FIG. 8 is a conceptual diagram for explaining the operation of the code generation unit shown in FIG. 6.

Referring to FIG. 8, when the code generation unit 440 is implemented with a successive approximation counter, the variation of the digital code CODE can be easily understood. The digital code CODE has a logic value of (1, 0, 0) whenever it is initialized. Subsequently, the code generation unit 440 increases the logic value of the digital code CODE to (1, 1, 0) or decreases the logic value of the digital code CODE to (0, 1, 0) according to whether the logic value of the signal transferred from the first multiplexer 430 is '0' or '1'. The code generation unit 440 sets the logic value of the digital code CODE to (1, 1, 1), (1, 0, 1), (0, 1, 1), or (0, 0, 1) according to the output signal of the first multiplexer 430. Accordingly the code generation unit 440 performs the above-described operation one more time, so that the digital code CODE has one of the logic values (0, 0, 0) to (1, 1, 1). The code generation unit 440 completes the operation of setting the logic value of the digital code CODE through the three-stage operation. If the general counter is used, a maximum seven-stage operation may be performed. However, if the successive approximation counter is used, the operation speed can be remarkably increased.

As described above, the data alignment circuit and method of the semiconductor memory apparatus perform the operation of adjusting the phase of the data strobe clock signal so that it is synchronized with the phase of the input data whose phase is lagging the most and then synchronizing the phases of the respective input data with the phase-adjusted data strobe clock signal. Therefore, since the data alignment operation can be performed stably without using additional clock signals, the area margin of the data alignment circuit of the semiconductor memory apparatus is increased and the area efficiency is improved. Furthermore, since the data alignment circuit is implemented in a simple circuit configuration compared with the related art, the design facilitation is improved.

While certain embodiments have been described above, it will be understood to those skilled in the art that the embodiments described are by way of example only. Accordingly, the data alignment circuit and method described herein should not be limited based on the described embodiments. Rather, the data alignment circuit and method described herein should only be limited in light of the claims that follow when taken in conjunction with the above description and accompanying drawings.

What is claimed is:

1. A data alignment circuit of a semiconductor memory apparatus, comprising:
    a data strobe clock phase control block configured to control a phase of a data strobe clock signal in response to a strobe delay code and generate a delayed strobe clock signal;
    a plurality of data phase control blocks configured to control phases of respective input data in response to respective data delay codes and generate respective delayed data;
    a plurality of data alignment blocks configured to latch the respective delayed data in response to the delayed strobe clock signal and generate respective latched data and aligned data; and
    a delay code generation block configured to determine phases is of the latched data and generate the strobe delay code and the data delay codes.

2. The data alignment circuit of claim 1, wherein the data strobe clock phase control block comprises:
    a register configured to store the strobe delay code; and
    a delay line configured to delay the data strobe clock signal in response to the strobe delay code transferred from the register and output the delayed strobe clock signal.

3. The data alignment circuit of claim 1, wherein the respective data phase control blocks comprise:
    a register configured to store a corresponding data delay code among the respective data delay codes; and
    a delay line configured to delay a corresponding input data among the respective input data in response to the data delay code transferred from the register and output a corresponding delay data among the respective delay data.

4. The data alignment circuit of claim 1, wherein the respective data alignment blocks are configured to latch respective bits of a corresponding delayed data among the respective delayed data at a rising edge time and a falling edge time of the delayed strobe clock signal and output 2-bit aligned data.

5. The data alignment circuit of claim 1, wherein the delay code generation block is configured to receive the plural latched data generated by the plurality of data alignment blocks, extract phase information of the received data whose phase is lagging the most among the plural latched data, and generate the strobe delay code.

6. The data alignment circuit of claim 5, wherein the delay code generation block is further configured to extract information on how much the phases of the latched data lead the phase of the delayed strobe clock signal, after the operation of generating the strobe delay code is completed, and output the extracted information as the data delay codes.

7. The data alignment circuit of claim 6, wherein the delay code generation block comprises:
    a counter configured to perform a counting operation in response to the delayed strobe clock signal and generate a plurality of operation duration signals;
    a phase determination unit configured to receive the latched data and generate a strobe phase determination signal;
    a first multiplexer configured to sequentially output the strobe phase determination signal and the latched data one by one in response to the plurality of operation duration signals;
    a code generation unit configured to generate a multi-bit digital code corresponding to a logic value of a signal, which is transferred from the first multiplexer, in response to the plurality of operation duration signals and the delayed strobe clock signal; and
    a second multiplexer configured to sequentially output the multi-bit digital code as the strobe delay code and the data delay codes in response to the plurality of operation duration signals.

8. The data alignment circuit of claim 7, wherein the code generation unit comprises a successive approximation counter for generating the multi-bit digital code.

9. A data alignment circuit of a semiconductor memory apparatus, comprising:
    a delay code generation block configured to receive a plurality of data, extract phase information of the received data whose phase is lagging the most among the plurality of data, and output the extracted information as a strobe delay code;
    a data strobe clock phase control block configured to control a phase of a data strobe clock signal in response to the strobe delay code and generate a delayed strobe clock signal; and
    a plurality of data alignment blocks configured to perform data latch operations by using the delayed strobe clock signal, output the plurality of data, and perform data alignment operations on the plurality of data.

10. The data alignment circuit of claim 9, wherein the delay code generation block is configured to extract information on how much phases of the plurality of data lead a phase of the delayed strobe clock signal, after the operation of generating the strobe delay code is completed, and output the extracted information as a plurality of data delay codes.

11. The data alignment circuit of claim 10, further comprising a plurality of data phase control blocks configured to control phases of input data in response to the plurality of data delay codes.

12. The data alignment circuit of claim 11, wherein the delay code generation block comprises:
- a counter configured to perform a counting operation in response to the delayed strobe clock signal and generate a plurality of operation duration signals;
- a phase determination unit configured to receive the plurality of data and generate a strobe phase determination signal;
- a first multiplexer configured to sequentially output the strobe phase determination signal and the plurality of data one by one in response to the plurality of operation duration signals;
- a code generation unit configured to generate a multi-bit digital code corresponding to a logic value of a signal, which is transferred from the first multiplexer, in response to the plurality of operation duration signals and the delayed strobe clock signal; and
- a second multiplexer configured to sequentially output the multi-bit digital code as the strobe delay code and the plurality of data delay codes in response to the plurality of operation duration signals.

13. The data alignment circuit of claim 12, wherein the code generation unit is configured to decrease a logic value of the multi-bit digital code when the signal transferred from the first multiplexer has a first logic value, and increase the logic value of the multi-bit digital code when the signal transferred from the first multiplexer has a second logic value.

14. The data alignment circuit of claim 13, wherein the code generation unit comprises a successive approximation counter for generating the multi-bit digital code.

15. The data alignment circuit of claim 9, wherein the data strobe clock phase control block comprises:
- a register configured to store the strobe delay code; and
- a delay line configured to delay the data strobe clock signal in response to the strobe delay code, which is transferred from the register, and output the delayed strobe clock signal.

16. The data alignment circuit of claim 11, wherein the respective data alignment units are configured to perform an operation of latching respective bits of the data transferred from any one of the plurality of data phase control blocks at a rising edge time and a falling edge time of the delayed strobe clock signal.

17. A data alignment method of a semiconductor memory apparatus, comprising:
- determining phases of a plurality of input data and extracting phase information of the input data whose phase is lagging the most among the plurality of input data;
- delaying a data strobe clock signal by using the extracted phase information and synchronizing the delayed data strobe clock signal with the input data whose phase is lagging the most; and
- delaying the plurality of input data so that the plural delayed input data have the same phase as the delayed data strobe clock signal.

18. The data alignment method of claim 17, wherein the step of determining phases and extracting phase information comprises:
- latching the plurality of input data in synchronization with the data strobe clock signal;
- performing a NAND operation on the latched signals; and
- generating a strobe delay code in response to a level of a signal generated through the NAND operation.

19. The data alignment method of claim 18, wherein the step of delaying a data strobe clock signal and synchronizing the delayed data strobe clock signal comprises: delaying the data strobe clock signal in response to the strobe delay code until the level of the signal generated by the NAND operation transits.

20. The data alignment method of claim 17, wherein the step of delaying the plurality of input data comprises:
- latching the plurality of input data in synchronization with the delayed data strobe clock signal;
- performing a NAND operation on the latched signals; and
- delaying the respective input data in response to a level of a signal generated through the NAND operation until the level of the signal generated by the NAND operation transits.

* * * * *